United States Patent [19]

Horikoshi

[11] 4,028,148

[45] June 7, 1977

[54] METHOD OF EPITAXIALLY GROWING A LAMINATE SEMICONDUCTOR LAYER IN LIQUID PHASE

[75] Inventor: Yoshiji Horikoshi, Tokyo, Japan

[73] Assignee: Nippon Telegraph and Telephone Public Corporation, Tokyo, Japan

[22] Filed: Aug. 19, 1976

[21] Appl. No.: 715,844

Related U.S. Application Data

[62] Division of Ser. No. 639,713, Dec. 11, 1975, Pat. No. 4,013,040.

[30] Foreign Application Priority Data

Dec. 20, 1974 Japan .................. 49-145599

[52] U.S. Cl. .................. 148/171; 148/172; 148/1.5; 252/62.3 GA
[51] Int. Cl.² .................. H01L 21/208
[58] Field of Search .......... 148/1.5, 171, 172, 415; 427/87; 156/624, 622

[56] References Cited

UNITED STATES PATENTS

| | | | |
|---|---|---|---|
| 3,665,888 | 5/1972 | Bergh | 118/58 |
| 3,755,011 | 8/1973 | Kleinknecht | 148/171 |
| 3,765,959 | 10/1973 | Unno et al. | 148/171 |
| 3,767,481 | 10/1973 | Ettenberg et al. | 148/171 |
| 3,821,039 | 6/1974 | Ettenberg | 148/171 |
| 3,896,765 | 7/1975 | Ariga | 148/415 X |
| 3,909,317 | 9/1975 | Itoh et al. | 148/171 |
| 3,940,296 | 2/1976 | van Oirschot et al. | 148/171 |

*Primary Examiner*—G. Ozaki
*Attorney, Agent, or Firm*—Flynn & Frishauf

[57] ABSTRACT

A method of epitaxially growing a laminate semiconductor layer in liquid phase on the crystalline surface of a substrate by successively bringing different kinds of liquid phase epitaxial growth solution into contact with the surface of a substrate, which is characterized in that different kinds of liquid phase epitaxial growth solutions are injected one after another into solution receptacle, the bottom of which is open to the substrate surface, and each of the preceding one of the epitaxial growth solutions is expelled from the solution receptacle by each succeeding one of the epitaxial growth solutions for interchange between both solutions and thereafter each succeeding solution is epitaxially grown on the preceding one.

4 Claims, 19 Drawing Figures

METHOD OF EPITAXIALLY GROWING A LAMINATE SEMICONDUCTOR LAYER IN LIQUID PHASE

This is a division of application Ser. No. 639,713, filed Dec. 11, 1975 now Pat. No. 4,013,040.

This invention relates to a method of epitaxially growing a laminate semiconductor layer in liquid phase, and more particularly to a method of epitaxially growing a laminate semiconductor layer in liquid phase with a good crystalline surface, using a plurality of metals belonging to the Groups III to V such as GaAs and $Al_xGa_{1-x}As$.

BACKGROUND OF THE INVENTION

Figure 1:
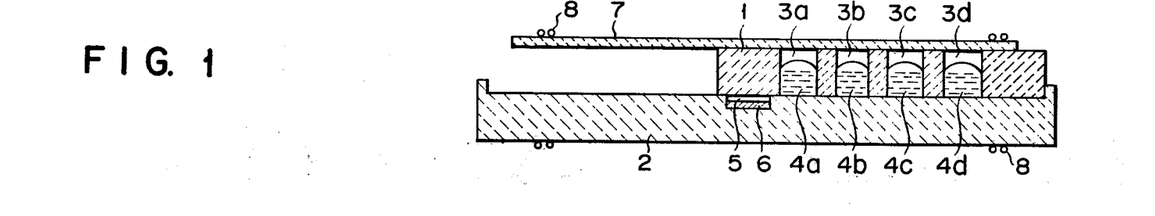
FIG. 1 is a longitudinal sectional view of a boat used withe the prior liquid phase epitaxial growth device.

The methods hitherto proposed to prepare a laminate semiconductor layer by liquid phase epitaxial growth from a plurality of metals belonging to the Groups III to V such as GaAs and $Al_xGa_{1-x}As$ include the Nelson's method, slide boat method and boat rotation method. These methods are all based on the principle of intermittently moving a plurality of tanks containing different kinds of epitaxial growth solution each having a prescribed composition, thereby successively bringing said epitaxial growth solutions into contact with the surface of a crystalline substrate. An example of the prior methods is set forth in, for example, a report by B. I. Miller et al appearing in "Journal of Applied Physics" vol. 43, No. 6, June 1972. The method proposed in said publication is of the slide boat type. There will now be described by reference to FIG. 1 this slide boat method. FIG. 1 is a fractional longitudinal sectional view of the prior art liquid phase epitaxial growth device. A crystalline substrate 6 is received in a substrate hole 5 bored in the upper surface of a substrate carrier 2. Closely mounted on said surface is a horizontally slidable solution tank holder 1 which contains a plurality of solution tanks 3a, 3b, 3c, 3d each open at the bottom and filled with solutions 4a, 4b, 4c, 4d respectively. A keep plate 7 is placed on the upper surface of the solution tank holder 1 so as to admit of the sliding thereof, and further fixed to the substrate carrier 2 by means of tungsten wires 8.

Where a laminate semiconductor layer is epitaxially grown in liquid phase by the conventional device of FIG. 1, the device is maintained at a prescribed temperature and filled with a reducing or inert gas. Where a laminate liquid phase epitaxial growth wafer is prepared, the solution tank holder 1 is intermittently carried from the right to the left in FIG. 1 to bring the solutions 4a, 4b, 4c, 4d into contact with the crystalline substrate in turn, thereby epitaxially growing a laminate semiconductor layer in liquid phase in the surface of the crystalline sybstrate.

However, the above-mentioned prior method has two noticeable drawbacks as described below. The first drawback is that where different solutions are epitaxially grown in liquid phase one after another, the solution tank holder 1 is intermittently moved to wipe off the unnecessary portion of the preceding liquid phase epitaxial growth solution deposited on the substrate surface by the bottom plate of said holder 1, resulting in the occurrence of scratches on the surface of said deposited layer; and that particularly with a light-emitting laminate epitaxially grown wafer, appearance of such scratches, however slight, imparts a decisive damage to the effective life and other properties of the resultant device. The second drawback is that where the epitaxial growth solutions are brought to the crystalline substrate 6 one after another, the surface of each epitaxially grown component of the laminate semiconductor layer is exposed to an inert or reducing gas; and that the inert or reducing gas, however purified, contains a minute amount of impurity, for example, oxygen, and therefore exposure of each epitaxially grown component to such impure inert or reducing gas, however, momentary, gives rise to various defects in the interface between the laminated epitaxially grown components. As the result, where an element such as a semiconductor laser is cut out from such epitaxially grown wafer, the yield will be decreased, and the life of the element will be subject to a condsiderable harmful effect.

It is known that the properties and life of, for example, a semiconductor laser and light-emitting diode is very sensitively affected by the condition of a heterojunction. However, the above-mentioned prior liquid phase epitaxial growth method presents difficulties in suppressing the occurrence of minute scratches on each epitaxial grown component deposited on the crystalline substrate when the unnecessary portion of said component is wiped off by the bottom plate of the solution tank holder, and also fails to prevent the surface of each epitaxially grown component from exposure to an ambient impure inert or reducing gas, resulting in the appearance of irregularities on the surface of the epitaxially grown deposit.

This invention has been accomplished with the view of eliminating the above-method drawbacks of the prior liquid phase epitaxial growth methods, and is intended to provide a method of epitaxially growing a laminate semiconductor layer in liquid phase and apparatus thereof which suppress the occurrence of scratches on the respective epitaxially grown formations and prevent their exposure to an ambient gaseous atmosphere while they are deposited on the substrate one after another.

SUMMARY OF THE INVENTION

The method of this invention for epitaxially growing a laminate semiconductor layer in liquid phase on the surface of a crystalline substrate by bringing different kinds of epitaxial growth solutions into contact with said surface in turn is characterized in that the different kinds of epitaxial growth solutions each having a prescribed composition are intermittently forced one after another through a solution receptacle, the bottom of which is open to the substrate surface, and that each preceding one of the epitaxial growth solutions deposited on the substrate surface is expelled therefrom by each succeeding one thereof for interchange between both solutions and thereafter the succeeding solution is epitaxially grown on top of the preceding one.

BRIEF DESCRIPTION OF THE DRAWINGS

This invention can be more fully understood from the following detailed description when taken in conjunction with the accompanying drawings, in which.

DETAILED DESCRIPTION

The liquid phase epitaxial growth method of this invention is characterized in that, where a laminate semiconductor layer is epitaxially grown from different kinds of solutions, the unnecessary portion of each preceding solution is expelled from a solution receptacle by each succeeding solution forcefully introduced into said receptacle by pressurizing means, and the succeeding solution is brought to a prescribed position on the substrate surface for epitaxial growth on top of the preceding one. Included among the published literature disclosing a method of epitaxially growing a laminate semiconductor layer by successively bringing different kinds of epitaxial growth solution into contact with the surface of a crystalline substrate using pressurizing means as described above is the U.S. Pat. No. 3,755,011. However, the primary object of this U.S. Pat. is to force an epitaxial growth solution under pressure through a small aperture, thereby mechanically removing oxides and other contaminants from the surface of the solution surface. Therefore, this U.S. Pat. is not based on the concept of expelling the unnecessary portion of each preceding one of different kinds of epitaxial growth solution already deposited in the surface of a substrate by each succeeding one from said substrate using pressurizing means and allowing the succeeding solution to be epitaxially grown on top of the preceding one, thereby providing an epitaxially grown laminate semiconductor layer, and consequently is not suggestive at all of this invention.

Figure 2:
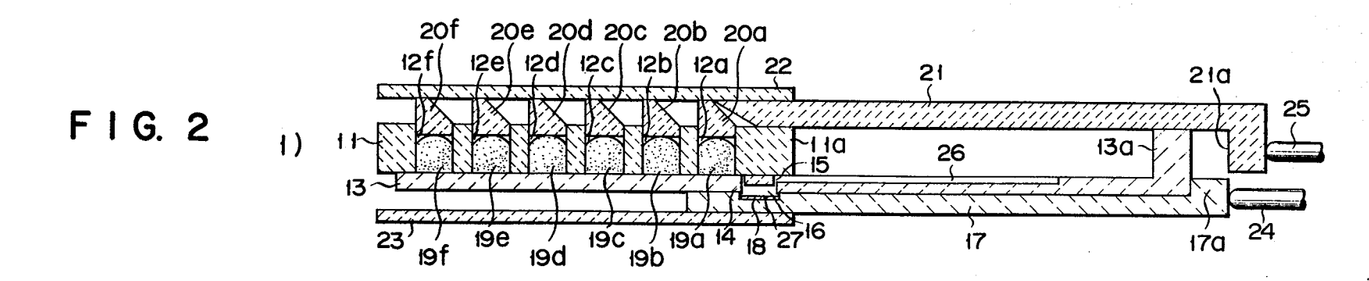
FIGS. 2 to 7 are longitudinal sectional views of a boat, showing the sequential steps of the liquid phase epitaxial growth method of the invention.
Figure 7:
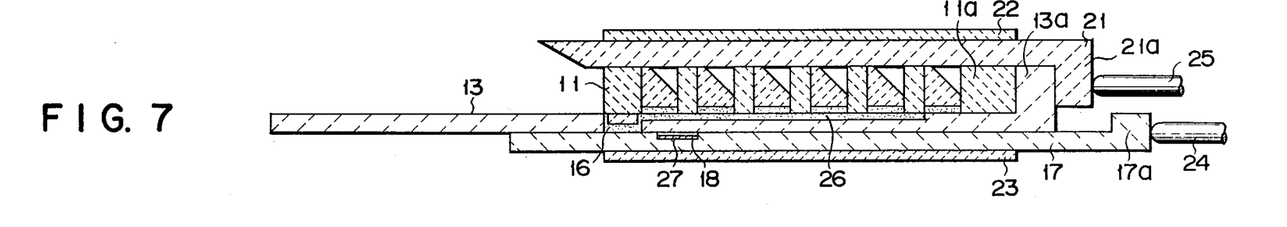
Figure 8:
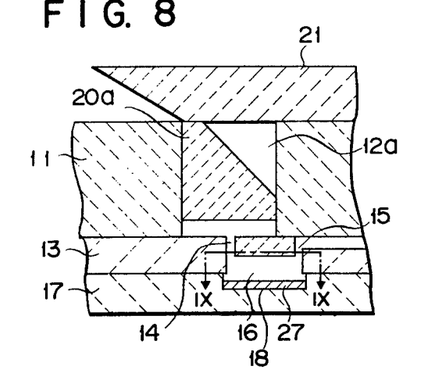
FIG. 8 is a fractional sectional view of a boat used with the liquid phase epitaxial growth apparatus of the invention.
Figure 9:
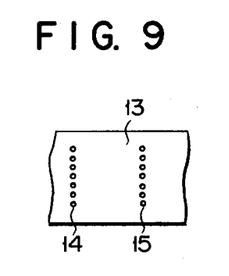
FIGS. 9, 10 are sectional views on line IX—IX of FIG. 8.
Figure 10:
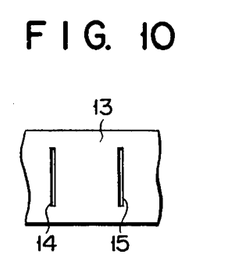
Figure 11:
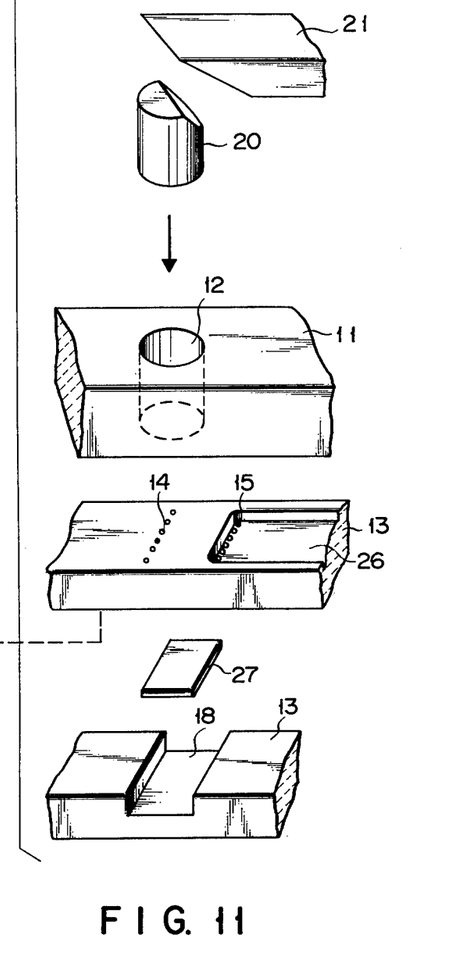
FIG. 11 is an exploded perspective view of a main portion of a boat embodying the invention.
Figure 12:
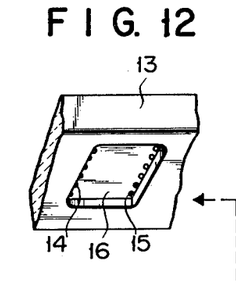
FIG. 12 is a perspective view of a portion of a solution receptacle-holding plate, showing the reverse side of a solution receptacle embodying the invention.

There will now be described by reference to FIGS. 2 to 12 a concrete embodiment of this invention. FIG. 2 is a longitudinal sectional view of a boat, showing its condition before liquid phase epitaxial growth is commenced. Referential numeral 11 is a solution tank holder in which there are linearly arranged, for example, a plurality of solution tanks 12a to 12f each open at the top and bottom. The solution tank holder 11 is closely mounted on a solution receptacle-holding plate 13 so as to slide on each other. The solution receptacle-holding plate 13 is provided with as shown in FIG. 11 a solution receptacle 16 having an inlet port 14 and outlet port 15 and being open at the bottom. Both inlet and outlet ports 14, 15 are each formed, as shown in FIG. 9 or FIG. 11, with a plurality of small linearly arranged apertures measuring 0.5 to 1.0 mm in diameter. The solution receptacle-holding-plate 13 is closely placed on a substrate holder 17 so as to slide on each other. The upper surface of said substrate holder 17 is bored with a depression 18 (FIG. 8 or FIG. 11) which is aligned with the solution receptacle 16. The solution tanks 12a to 12f received in the solution tank holder 11 are filled with solutions 19a to 19f having different prescribed compositions. Disposed in the solutions 19a to 19f are pressurizing members 20a to 20f closing said solutions from above and sliding on the inner walls of the solution tanks 12a to 12f. Each of the pressuring members 20a to 20f has a tapered upper surface as shown in FIG. 2 or FIG. 11. A pressurizing member-actuating plate 21 which is also provided with a tapered portion facing the tapered portion of each pressurizing member is slidably mounted on the solution tank holder 11. When said actuating plate 21 is moved to the left in FIG. 2, the tapered portion thereof abuts against the tapered portion of the pressurizing members 20a to 20f in turn, thereby pressing them downward successively. An assembly of the solution tank holder 11, solution receptacle-holding plate 13, substrate holder 17, pressurizing members 12a to 12f, and pressurizing member-actuating plate 21 are slidably supported on both upper and lower sides by means of keep plates 22, 23 respectively.

Figure 3:
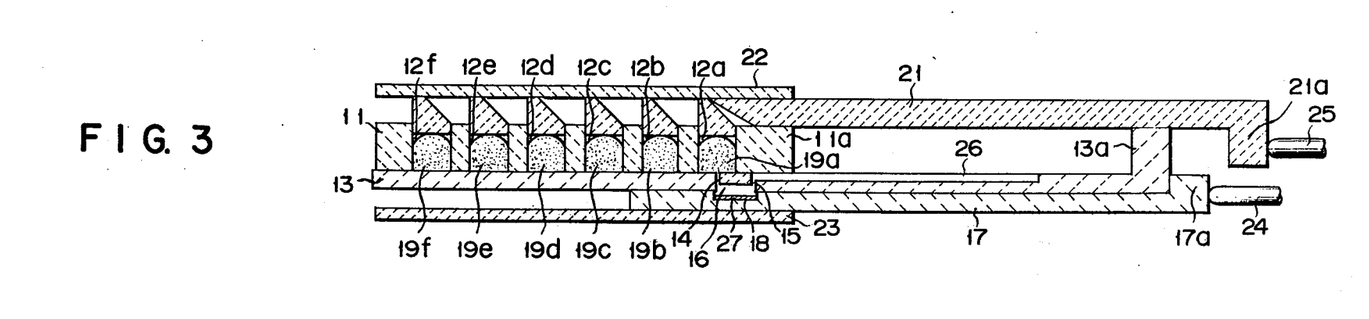
Figure 4:
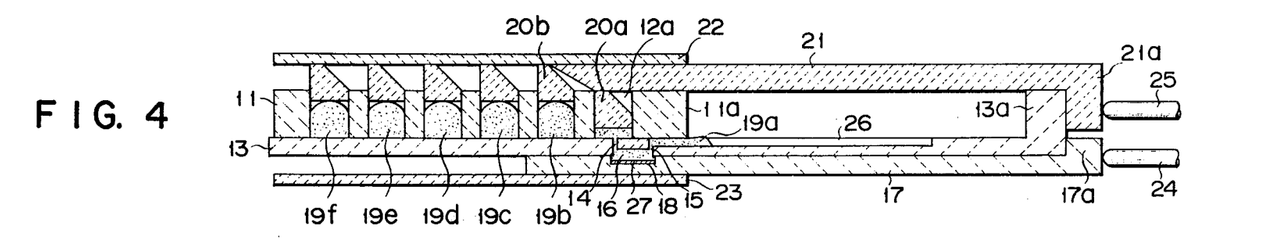
Figure 5:
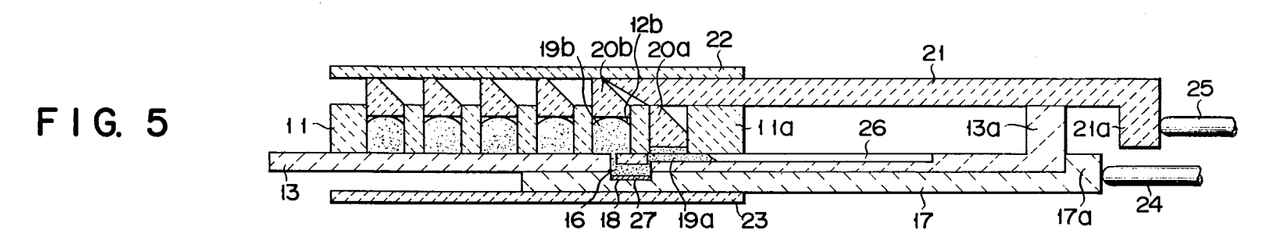
Figure 6:
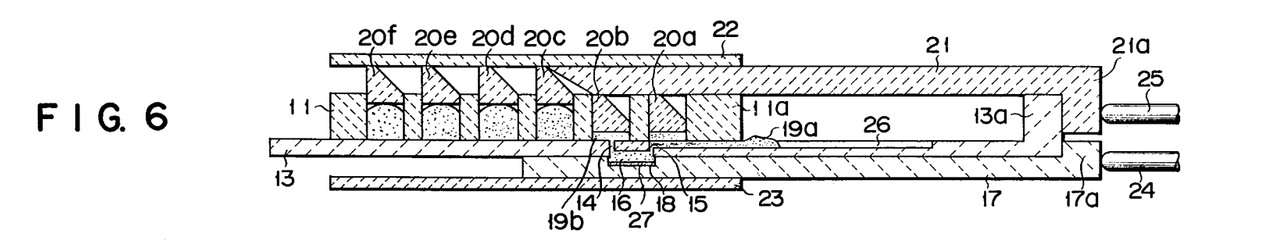

The substrate holder 17 can be moved to the left when a push rod 24 is pressed against a projection 17a formed at one end of the substrate holder 17. The pressurizing member-actuating plate 21 can similarly be moved to the left when another push rod 25 abuts against a projecting end 21a of said actuating plate 21. A projection 13a is also formed at one end of solution receptacle-holding plate 13. When the substrate holder 17 is carried to the left, the projection 17a engages the lower part of the projection 13a of the solution receptacle-holding plate 13, causing both substrate holder 17 and solution receptacle-holding plate 13 to be conducted to the left thereby maintaining the alignment of the solution receptacle 16 with the depression 18. When the pressurizing member-actuating plate 21 is moved to the left with the projection 21a thereof engaged with the projection 13a of the solution receptacle-holding plate 13, then both holding plate 13 and actuating plate 21 are transported to the left as shown in FIG. 7 wherein the last solution is wiped off by the reverse side of the plate 13. A referential numeral 26 denotes a shallow elongate waste solution receptacle which is provided in the upper surface of the solution receptacle-holding plate 13, and one end of which communicates with the outlet port 15 of the solution receptacle 16.

Where the liquid phase epitaxial growth method of this invention is carried out by the above-mentioned apparatus, solutions 19a to 19f, each having a prescribed composition, are filled into the solution tanks 12a to 12f and a crystalline substrate 27 is introduced into the depression 18, and thereafter the whole apparatus is placed in an atmosphere of a prescribed type of gas and maintained at a prescribed temperature. FIG. 2 shows the condition of a boat used with said apparatus before liquid phase epitaxial growth is commenced. Referring to FIG. 2 the substrate hole 18 receiving a crystalline substrate 27 and solution receptacle 16 are aligned with each other. However, the inlet port 14 of the solution receptacle 16 is closed by the bottom plate of one end portion 11a of the solution tank holder 11. When the push rod 24 moves the substrate holder 17 to the left the solution receptacle-holding plate 13 is also carried to the left by the projection 17a of said substrate holder 17, maintaining the alignment of the solution receptacle 16 with the depression 18 and causing the inlet port 14 of the solution receptacle 16 to communicate with, for example, a solution tank 12a (FIG. 3). Where, under this condition, the pressurizing member-actuating plate 21 is conducted to the left by the push rod 25, then a pressurizing member 20a, for example, is let down the inner walls of the corresponding solution tank 12a as shown in FIG. 4 or 8, causing the corresponding solution 19a forcefully to flow through the inlet port 14 into the solution receptacle 16 and also on to the crystalline substrate 27. The unnecessary portion of the solution 19a epitaxially grown on the surface of a substrate 27 runs out through the outlet port 15 into the waste solution receptacle 26 by the force of the following solution 19b introduced under pressure by means of the pressurizing means. In this case, as the injection of the solution 19a is finished before the projection 21a is contacted with the projection 13a, the engagement of the projection 13a with the projection 17a is maintained during the movement of the actuating plate 21, thus keeping the depression 18 and solution receptacle 16 overlapping each other. Under this condition, the solution 19a is allowed to stand on the substrate for a prescribed length of time with the temperature decreased to a certain level, thereby carrying out the epitaxial growth of a first component of a laminate epitaxial growth layer. When the epitaxial growth is nearly brought to an end, the substrate holder 17 and solution receptacle-holding plate 13 are carried to the left by the push rod 24 to bring the inlet port 14 of the solution receptacle 16 to the substantially central part of the solution tank 12b as shown in FIG. 5. Thereafter, the pressurizing member-actuating plate 21 is transported to the left by the push rod 25 to bring down the pressurizing member 20b, thereby causing the solution 19b of the corresponding solution tank 12b to flow into the solution receptacle 16 through the inlet port 14 thereof. Prior to this point of time, the epitaxial growth of the first solution 19a is already brought to an end in the solution receptacle 16. Upon the forced influx of the second fresh solution 19b, the unnecessary portion of the preceding solution 19a is expelled through the outlet port 15 of the solution receptacle 16 into the waste solution receptacle 26 (FIG. 6). Therefore, the solution receptacle 16 is now filled with the second solution 19b on top of the preceding epitaxially grown solution 19a. Repetition of the above-mentioned operation provides a prescribed laminate semiconductor layer epitaxially grown in liquid phase. The alignment of the depression 18 and the solution receptacle 16 is maintained until the final epitaxial growth is terminated. Upon completion of the production of said laminate layer, the crystalline substrate 27 is taken out in a state covered with the last solution 12f. Where the last epitaxially grown solution 12f is desired to have a mirror-finished surface, then the solution receptacle-holding plate 13 is further carried to the left by the push rod 25 to be separated from the substrate 17 thus disengaging the alignment of the solution receptacle 16 with the depression 18. The surface of the last solution 12f is smoothed out by being gently wiped off, using mechanical means.

As apparent from the foregoing description, the liquid phase epitaxial growth method of this invention allows the surface of a crystalline substrate to be covered with epitaxial growth solution one after another throughout the cycle of epitaxially growing a laminate semiconductor layer, thereby preventing the surface of each epitaxially grown component from being exposed to a gaseous atmosphere. Moreover, according to this invention, the wiping-off of the unnecessary portion of each preceding one of the epitaxially grown components laminated in succession is effected by the force of each succeeding solution introduced under pressure by the corresponding pressurizing means, instead of mechanically as in the prior art, by closely attaching a solid body to the surface of the epitaxially grown solution, thereby suppressing the occurrence of any slight scratch on said surface. Therefore, an element such as a semiconductor laser can be obtained from an epitaxially grown wafer prepared by the method of this invention with a far higher yield and a prominently longer life than in the prior art.

Figure 13:
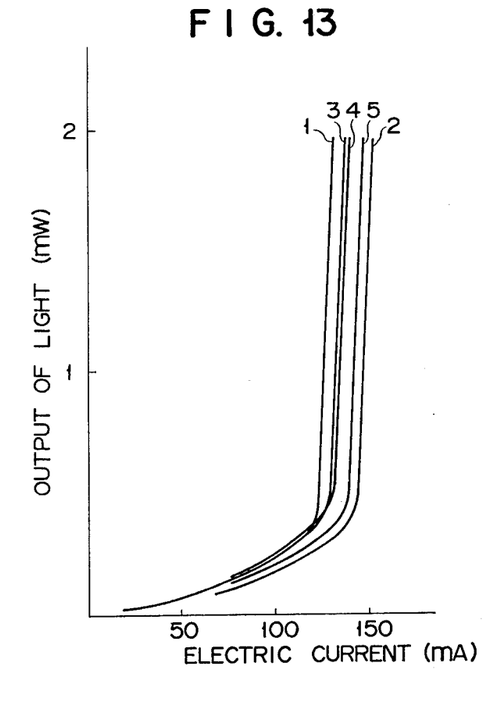
FIG. 13 is a curve diagram showing the electric current vs. light output characteristic of randomly chosen semiconductor lasers cut from a semiconductor wafer obtained by the method of the invention.
Figures 14, 15:
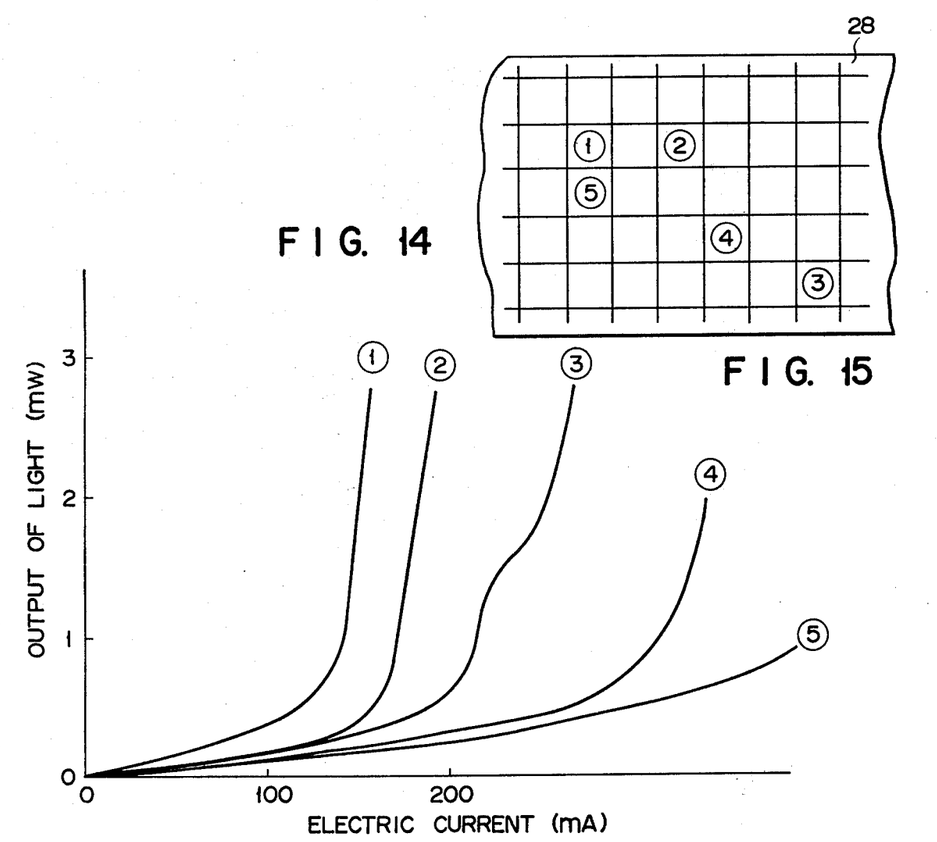
FIG. 14 is a curve diagram showing the electric current vs. light output characteristic of randomly chosen semiconductor lasers cut from a semiconductor wafer obtained by the prior method.
FIG. 15 is a plan view of the semiconductor laser pellets, showing those portions which were selected to determine the properties illustrated in FIGS. 13, 14.

FIGS. 13 to 15 set forth the properties of semiconductor laser pellets obtained from the epitaxially grown wafer of this invention and that of the conventional slide boat method, showing the effective yields of both types of semiconductor laser pellets. Referential numeral 28 is a fractional plan view of an epitaxially grown wafer. Measurement was made of the light-emitting property of the present and prior art semiconductor laser pellets cut out from the randomly selected portions 1 to 5 of said wafer. FIG. 13 indicates the light-emitting property of the semiconductor laser pellets cut out from an epitaxially grown wafer prepared by the method of this invention. As seen from FIG. 13, the laser pellets of the invention display a high differential efficiency substantially alike. In contrast, FIG. 14 sets forth the measured light-emitting properties of semiconductor laser pellets cut out from an epitaxially grown wafer obtained by the prior art method, showing that many of the laser pellets had a lower differential efficiency and were produced with a far smaller yield than those of the present invention.

Figure 16:
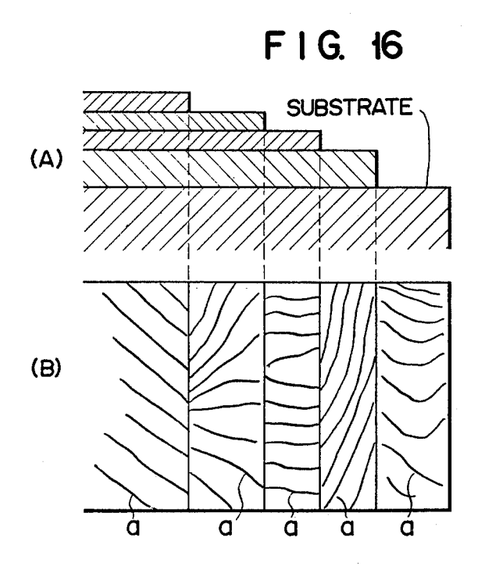
FIGS. 16, 17 set forth the surface condition of epitaxially grown laminate layers prepared by the prior method and that of the invention respectively.
Figure 17:
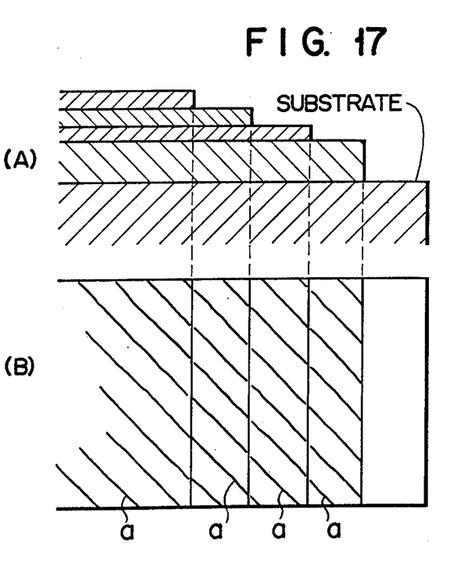

FIGS. 16, 17 indicate a difference of epitaxial wafers obtained from a laminate semiconductor layer epitaxially grown in liquid phase by the method of this invention and those derived from a laminate semiconductor layer epitaxially grown by the prior slide boat method. The respective components of both types of epitaxially grown laminate layer are shown in the stepped form by carrying out selective etching. The A section of FIGS. 16, 17 is a sectional view of said laminate layer and the B section thereof is the corresponding plan view. FIG. 16 represents the laminate layer epitaxially grown by the prior method. As illustrated in the B section of FIG. 16, the surface morphology of a laminate layer epitaxially grown by the conventional method presents striped patterns consisting of a plurality of lines $a$ running in different directions for each stepped portion. Therefore, a large number of cross points of stripes appear in the respective stepped portions. Some of the so-called dark lines are known to extend from said cross points of stripes. Though a reason for the appearance of said dark lines has not yet been clearly defined, it is assumed that the cross points of stripes constitute one of the causes for accelerating the deterioration of a semiconductor laser. In contrast, the plane of an epitaxially grown laminate layer shown in FIG. 17 shows striped patterns consisting of a plurality of lines a extending in substantially the same direction for each stepped portion in such a manner that the lines of the adjacent stepped portion are brought into alignment, thus presumably eliminating the occurrence of cross points of respective lines as in the case of FIG. 16. It will be understood from this respect that a laminate semiconductor layer epitaxially grown by this invention has a noticeably longer life than the conventional product.

Figure 18:
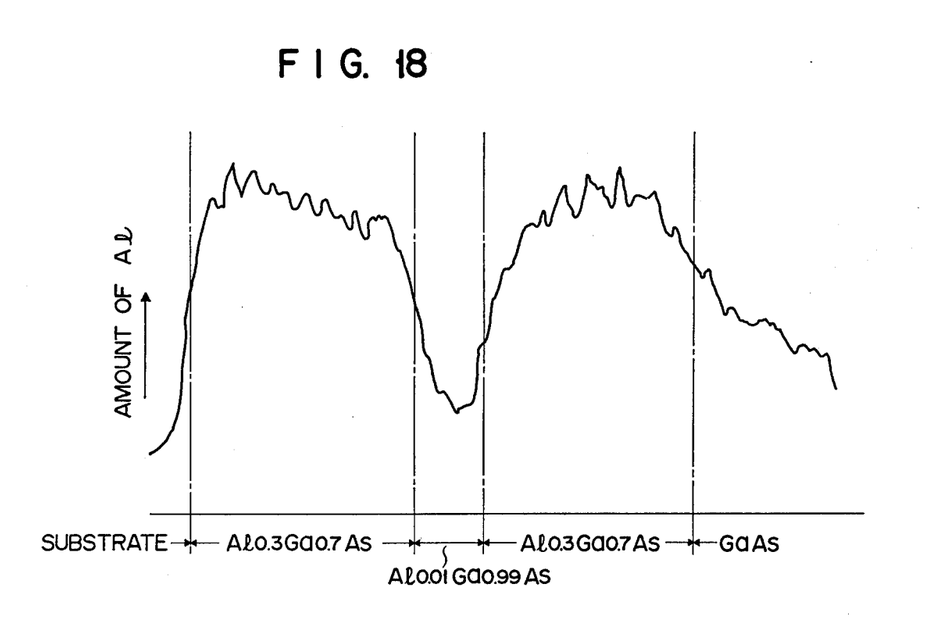
FIGS. 18, 19 show changes in the amounts of the chemical components of the respective constituents of a laminate epitaxially grown layer obtained by the method of the invention as assumed from changes in the proportion of aluminium, a chemical component of said constituent.
Figure 19:
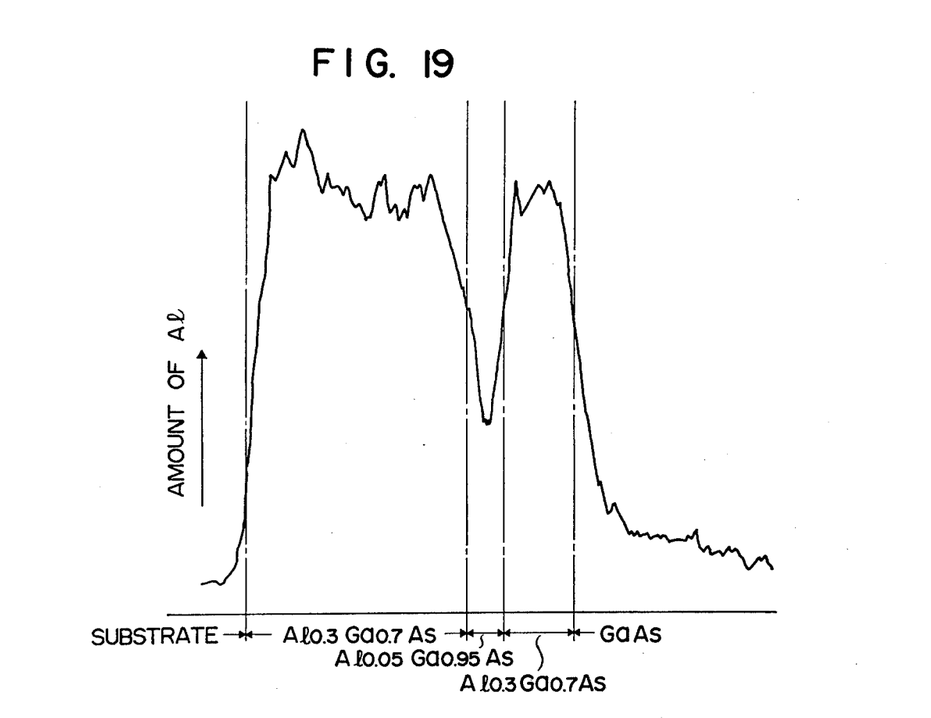

With the method of this invention by which the unnecessary portion of each preceding one of the respective epitaxial growth solutions successively deposited on the crystalline substrate is wiped off by each succeeding solution forcefully introduced into the solution receptacle 16, it may be feared that contamination will take place between said preceding and succeeding solutions. However, adjustment of the depth of the solution receptacle 16 to, for example, a smaller level than 1.5 mm enables interchange between the adjacent solutions to be effected almost completely, raising no practical problem. Further, a laminate semiconductor layer epitaxially grown by the method of this invention does not present a sharp hetero-junction as in the product of the prior method, and prevents stresses from being centered only on the boundaries of the adjacent components of an epitaxially grown laminate semiconductor layer, and is therefore considered to offer great advantage in extending the life of, for example, a semiconductor laser and light-emitting diode. FIG. 18 shows changes in the amounts of components of the double hetero-structure wafer epitaxially grown by the method of this invention shown in FIGS. 2 to 7, as assumed from changes in the proportion of aluminium, a component of said epitaxially grown laminate semiconductor layer. Measurement of the amounts of said components was effected by grinding at an angle of 1° the double hetero-wafer and determining the proportion of aluminium component by an XMA (X ray micro analyser) for scanning electron beams emitted at right angles to the surface of an epitaxially grown laminate semiconductor layer. The curve diagram of FIG. 18 shows that contamination between the adjacent epitaxial growth solutions does not raise any serious problem. To prevent contamination between the adjacent epitaxial growth solutions as much as possible, it is advised, if necessary to fill two or more adjacent tanks with an epitaxial growth solution having the same composition so as to effectively wash off the unnecessary portion of each preceding epitaxial growth solution already deposited on the crystalline substrate or sufficiently enlarge the capacity of each solution tank fully to expell the excess portion of each preceding epitaxial growth solution deposited on the crystalline substrate. FIG. 19 shows changes in the amounts of components of a double hetero-wafer obtained by applying not only an epitaxial growth solution but also another solution for washing the surface of the double hetero-wafer on both sides of the active junction thereof measurement of said changes being carried out in the same manner as in FIG. 18. FIG. 19 shows that the amounts of chemical components of the aforesaid wafer were changed more sharply than in FIG. 18, but in the same degree as in the case of the prior art slide boat method.

The foregoing description refers to the embodiment where the inlet port 14 and outlet port 15 formed at the upper part of the solution receptacle 16 each consisted of numerous linearly arranged small apertures. However, this invention is not limited thereto, but both inlet and outlet ports 14, 15 may be formed of slits as shown in FIG. 10. These small apertures are chosen to have a diameter of about 0.5 to 1.0 mm, or the slits are preferred to have a width of similarly about 0.5 to 1.0 mm.

The above-mentioned liquid phase epitaxial growth apparatus of this invention has the following characteristics:

1. The unnecessary portion of each preceding one of the respective epitaxial growth solutions deposited on the surface of a crystalline substrate is expelled from a solution receptacle by the force of each succeeding one introduced thereinto under pressure, 2. Therefore, the respective constituents of an epitaxially grown laminate semiconductor layer are not exposed to an ambient gaseous atmosphere while being deposited on the surface of the crystalline substrate throughout the cycle of epitaxially growing said laminate semiconductor layer, and 3. Adjustment of the depth of the solution receptacle 16 can effectively suppress contamination between the adjacent epitaxial growth solutions.

This invention having the abovementioned characteristics fully eliminates the drawbacks of the prior method, for example, the occurrence of mechanical scratches on the surface of each epitaxially grown constituent of a laminate layer deposited on a crystalline substrate and the appearance of irregularities on the surface of each epitaxial grown constituent and an interface between the adjacent epitaxially grown constituent caused by exposure to an ambient gaseous atmosphere (mainly residual oxygen). Moreover, the above-mentioned advantageous effect described under item 2 attains the free control of the sharpness of a curve representing the degree in which the adjacent epitaxial growth solutions are mixed with each other, thereby widely distributing residual stresses occurring in an epitaxially grown laminate semiconductor layer.

The foregoing description refers to the case where this invention was applied to the slide boat method. However, the invention is not limited thereto, but may be applied to, for example, Nelson's method and the boat-rotating method.

What is claimed is:

1. A method of epitaxially growing a laminate semiconductor layer in liquid phase on the surface of a crystalline substrate by bringing different kinds of liquid phase epitaxial growth solutions into contact with said surface, which characteristically comprises the steps of expelling the unnecessary portion of each preceding one of the respective epitaxial growth solutions deposited on the surface of the crystalline substrate by each succeeding one from said surface for interchange between the adjacent epitaxial growth solutions, and repeating said operation for the epitaxial growth of a laminate semiconductor layer.

2. A method according to claim 1, wherein interchange between the preceding and succeeding epitaxial growth solutions is carried out by forcing the succeeding epitaxial growth solution under pressure into one end portion of a solution receptacle filled with the preceding epitaxial growth solution through a plurality of small apertures and expelling the unnecessary portion of the preceding epitaxial growth solution through the other end portion of said solution receptacle after the preceding epitaxial growth solution is deposited on the surface of the crystalline substrate.

3. A method according to claim 1, wherein interchange between the preceding and succeeding epitaxial growth solutions is effected by applying the succeeding epitaxial growth solution twice or more frequently in succession so as to effectively expel the unnecessary portion of the preceding epitaxial growth solution deposited on the surface of the crystalline substrate.

4. A method according to claim 1, wherein, upon completion of the deposition of all constituents of an epitaxially grown laminate semiconductor layer, the unnecessary portion of the last deposited component is wiped off for producing a mirror finish by causing the bottom plate of the substrate holder to slide in close contact with the surface of said last deposited component.

* * * * *